(12) United States Patent
Kajiyama et al.

(10) Patent No.: US 9,964,857 B2
(45) Date of Patent: May 8, 2018

(54) BEAM EXPOSURE DEVICE

(71) Applicant: V TECHNOLOGY CO., LTD., Kanagawa (JP)

(72) Inventors: Koichi Kajiyama, Kanagawa (JP); Shin Ishikawa, Kanagawa (JP); Takayuki Sato, Kanagawa (JP); Kazushige Hashimoto, Kanagawa (JP)

(73) Assignee: V TECHNOLOGY CO., LTD., Kanagawa (JP)

(*) Notice: Subject to any disclaimer, the term of this patent is extended or adjusted under 35 U.S.C. 154(b) by 0 days. days.

(21) Appl. No.: 15/124,701

(22) PCT Filed: Feb. 26, 2015

(86) PCT No.: PCT/JP2015/055524
§ 371 (c)(1),
(2) Date: Sep. 9, 2016

(87) PCT Pub. No.: WO2015/137125
PCT Pub. Date: Sep. 17, 2015

(65) Prior Publication Data
US 2017/0017163 A1   Jan. 19, 2017

(30) Foreign Application Priority Data
Mar. 11, 2014 (JP) .................... 2014-047904

(51) Int. Cl.
*G03B 27/54* (2006.01)
*G03F 7/20* (2006.01)
(Continued)

(52) U.S. Cl.
CPC ............ *G03F 7/7015* (2013.01); *B41J 2/447* (2013.01); *B41J 2/47* (2013.01); *G03F 7/2057* (2013.01);
(Continued)

(58) Field of Classification Search
CPC ....... B41J 2/447; B41J 2/47; G03G 15/04054; G03G 15/04; G03F 7/7015; G02B 13/00
See application file for complete search history.

(56) References Cited

U.S. PATENT DOCUMENTS 6,133,986 A * 10/2000 Johnson ............. G02B 21/0028
355/43
6,204,875 B1 * 3/2001 De Loor .................. B41J 2/451
347/239
(Continued)

FOREIGN PATENT DOCUMENTS

CN   101107572 A   1/2008
CN   103250231 A   8/2013
(Continued)

OTHER PUBLICATIONS

International Search Report issued in corresponding application No. PCT/JP2015/055524 dated May 19, 2015 (4 pages).
(Continued)

*Primary Examiner* — Deoram Persaud
(74) *Attorney, Agent, or Firm* — Osha Liang LLP

(57) ABSTRACT

A beam exposure device includes a light-emitting unit for emitting light beams from a plurality of light-emitting positions, a scan unit, an optical condensing system for condensing a spot of the light beams onto a surface to be exposed, and a micro-deflection unit for micro-deflecting the plurality of light beams to expose the space between the beams in the plurality of light beams. The optical condensing system includes a first microlens array arranged between the light-emitting unit and the micro-deflection unit and provided with a plurality of microlenses corresponding to the light-emitting positions; and a second microlens array arranged between the micro-deflection unit and the surface
(Continued)

to be exposed and provided with a plurality of microlenses each microlens corresponding to the light-emitting unit.

5 Claims, 5 Drawing Sheets

(51) Int. Cl.
   *B41J 2/447* (2006.01)
   *G03G 15/04* (2006.01)
   *B41J 2/47* (2006.01)

(52) U.S. Cl.
   CPC .......... *G03F 7/704* (2013.01); *G03F 7/70391* (2013.01); *G03G 15/04054* (2013.01)

(56) References Cited

U.S. PATENT DOCUMENTS

| | | | | |
|---|---|---|---|---|
| 6,967,711 | B2* | 11/2005 | Gui | G03F 7/70275 355/53 |
| 2002/0012153 | A1 | 1/2002 | Sunagawa | |
| 2002/0126479 | A1* | 9/2002 | Zhai | G02B 5/32 362/244 |
| 2002/0167751 | A1* | 11/2002 | Lee | G11B 5/584 360/72.1 |
| 2002/0171047 | A1* | 11/2002 | Chan | G03F 7/70216 250/492.1 |
| 2003/0091277 | A1* | 5/2003 | Mei | G02B 6/04 385/33 |
| 2004/0124372 | A1* | 7/2004 | Gil | G03F 7/70275 250/492.2 |
| 2006/0001855 | A1* | 1/2006 | Lof | G03F 7/70275 355/69 |
| 2007/0296936 | A1* | 12/2007 | Kato | G03F 7/70275 355/52 |
| 2008/0032066 | A1* | 2/2008 | Stiblert | G03F 7/70391 427/595 |
| 2008/0117494 | A1 | 5/2008 | Noordman et al. | |
| 2008/0212173 | A1* | 9/2008 | Mizusawa | G03F 7/7005 359/385 |
| 2009/0296063 | A1* | 12/2009 | Opower | G02B 26/123 355/67 |
| 2013/0242281 | A1* | 9/2013 | Mizumura | G03F 7/70191 355/71 |

FOREIGN PATENT DOCUMENTS

| | | | |
|---|---|---|---|
| CN | 103597404 | A | 2/2014 |
| JP | 2001305449 | A | 10/2001 |
| JP | 2004038051 | A | 2/2004 |
| JP | 2008109132 | A | 5/2008 |
| JP | 2010014797 | A | 1/2010 |
| JP | 2010262000 | A | 11/2010 |
| WO | 2012/136434 | A2 | 10/2012 |
| WO | WO 2012136434 | A2 * | 10/2012 ............. G03F 7/704 |

OTHER PUBLICATIONS

Written Opinion of the International Searching Authority issued in corresponding application No. PCT/JP2015/055524 dated May 19, 2015 (4 pages).

Office Action in counterpart Chinese Patent Application No. 201580007561.7 dated Jul. 11, 2017 (15 pages).

Office Action in counterpart Japanese Patent Application No. 2014-047904 dated Oct. 3, 2017 (6 pages).

Office Action issued in corresponding Chinese Application No. 201580007561.7 dated Jan. 29, 2018 (14 pages).

* cited by examiner

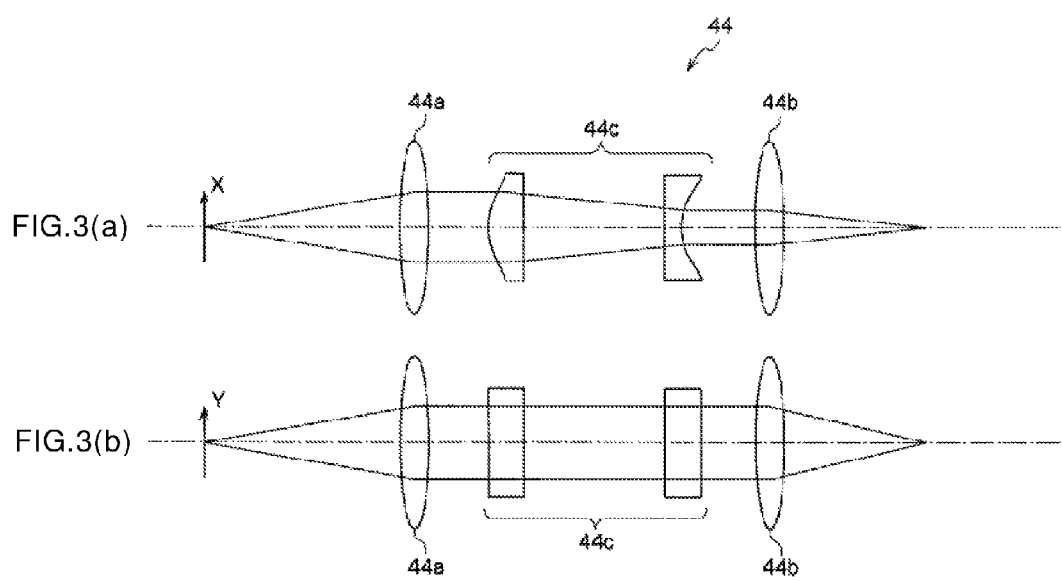

BEAM EXPOSURE DEVICE

FIELD

The present invention relates to a beam exposure device.

BACKGROUND

Beam scanning exposure is one known method of refining the spot diameter of a light beam, such as a laser beam, to expose a two-dimensional surface; specifically, a beam scanning device such as a galvano-mirror or a polygonal mirror performs a main scan of the two dimensional surface with a single light beam in one direction while the surface to be exposed moves along a sub-scanning direction that intersects with the main scanning direction. The beam scanning exposure technique requires the beam scanning device to rotate at faster speeds when performing high density exposure of a large surface area in order to minimize the exposure process time, thus leading to concern that the vibrations of the drive source or the beam scanning device itself at that time will adversely affect the optical system.

Multi-beam exposure is another known method of two-dimensional exposure with a light beam; here, a one-dimensional light source array emits a plurality of light beams, and the surface to be exposed moves along a direction intersecting with the arrangement direction of the light source array. Given there is a limit to how narrow the gap may be between light sources in the plurality of light sources, the light source array must be repeatedly shifted along the arrangement direction to expose the space between the light beams, which requires high-precision positioning when shifting the light source array.

In contrast, another method based on the above multi-beam exposure technique performs micro-deflection of the plurality of light beams to expose the space between light beams while keeping the light source array itself stationary (refer to Patent Document 1 below). In the existing technology, the beam scanning device is provided with a light source unit for emitting a plurality of light beams spaced at predetermined intervals in a single direction; a scan unit for scanning a surface exposed to the plurality of light beams; an imaging optical system for forming an image of the light beams emitted from the light source unit onto the surface to be exposed; and a micro-deflection unit for micro-deflecting the plurality of beams all at once to expose the space between the beams in the plurality of light beams. Here, the micro-deflection unit may be an acousto-optical element, an electro-optical element or the like.

CITATION LIST

Patent Documents

[Patent Document 1] Japanese Patent Application Publication No. 2001-305449

SUMMARY

Because a multi-beam exposure device provided with the above micro-deflection unit has a stationary light source and only micro-deflects the light beams, adverse effects from the vibrations of the drive source or potential issues with positioning accuracy when shifting the light source may be avoided; additionally, because the number of light beams may be increased to reduce the space between light beams and thereby reduce the micro-deflection distance of the light beams, the scanning speed increases in proportion thereto, and also shortens the exposure process time with regard to high-density exposure of large areas.

However, the existing multi-beam exposure device, provided with the optical system for forming an image on the surface to be exposed at a light-emitting position for the light source, uses a large-diameter collimating lens to condense the plurality of light beams arranged spaced at predetermined intervals along a single direction; the beams then pass through the micro-deflection unit and are guided to an image forming lens. Consequently, when an acousto-optical element or an electro-optical element serves as the micro-deflection unit, the light beams passing through at the fringes of the collimating lens and the light beams passing through the center portion of the collimating lens are incident on the micro-deflection unit at different angles of incidence; when the micro-deflection unit has deflection properties that are dependent on the angle of incidence, unfortunately, the plurality of light beams cannot be uniformly micro-deflected.

In contrast, one or more embodiments of the present invention achieve highly precise beam exposure with a beam exposure device that uses a micro-deflection unit such as an acousto-optical element or an electro-optical element to micro-deflect a plurality of light beams relative to each other, and uniformly micro-deflect the plurality of light beams.

According to one or more embodiments, a beam exposure device is provided with the following configurations.

A beam exposure device including: a light-emitting unit that emits light beams from a plurality of light-emitting positions spaced at predetermined intervals along one direction; a scan unit that moves one or both of a surface to be exposed to a plurality of light beams and the light-emitting unit relatively in another direction intersecting with the one direction; an optical condensing system that condenses a spot of the light beam emitted from the light-emitting unit onto the surface to be exposed; and a micro-deflection unit that micro-deflects the plurality of light beams to expose the space between the beams in the plurality of light beams; the optical condensing system including a first microlens array arranged between the light-emitting unit and the micro-deflection unit, and provided with a plurality of microlenses with each of the microlens corresponding to the light-emitting position in the light-emitting unit; and a second microlens array arranged between the micro-deflection unit and the surface to be exposed, and provided with a plurality of microlenses with each microlens corresponding to the light-emitting position in the light-emitting unit.

EFFECTS

According to this kind of exposure device, an optical condensing system which condenses a spot of a light beam emitted from a light-emitting unit, is provided with a first microlens array and a second microlens array arranged corresponding to a light-emitting position in the light-emitting unit; arranging the micro-deflection unit between the first microlens array and the second microlens array makes the angle of incidence of the plurality of light beams incident on the micro-deflection unit consistent. Hereby, the plurality of light beams may be uniformly micro-deflected even when the deflection properties of the micro-deflection unit are dependent on the angle of incidence.

BRIEF DESCRIPTION OF THE DRAWINGS

FIG. 1 is an explanatory diagram illustrating an overall configuration of a beam exposure device according to one or more embodiments of the invention.

FIG. 2 is an explanatory diagram illustrating a configuration example of the optical condensing system used in a beam exposure device according to one or more embodiments of the invention.

FIG. 3 is an explanatory diagram illustrating a configuration example of a relay lens system in the optical condensing system inside a beam exposure device according to one or more embodiments of the invention: FIG. 3(a) is a view from the Y direction, and FIG. 3(b) is a view from the X direction;

DETAILED DESCRIPTION

Figure 1A:
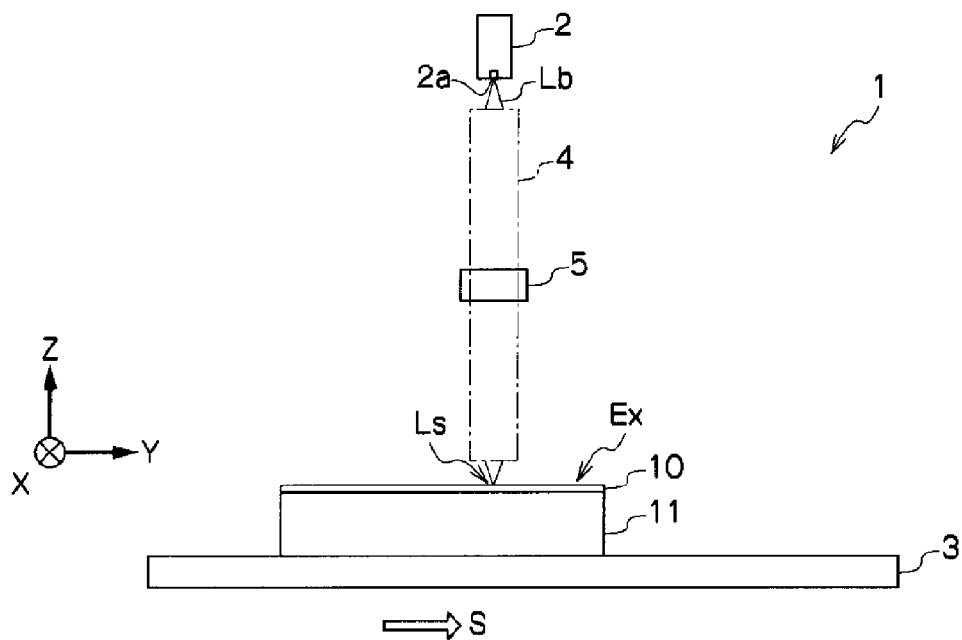
FIG. 1(a) is a side view.
Figure 1B:
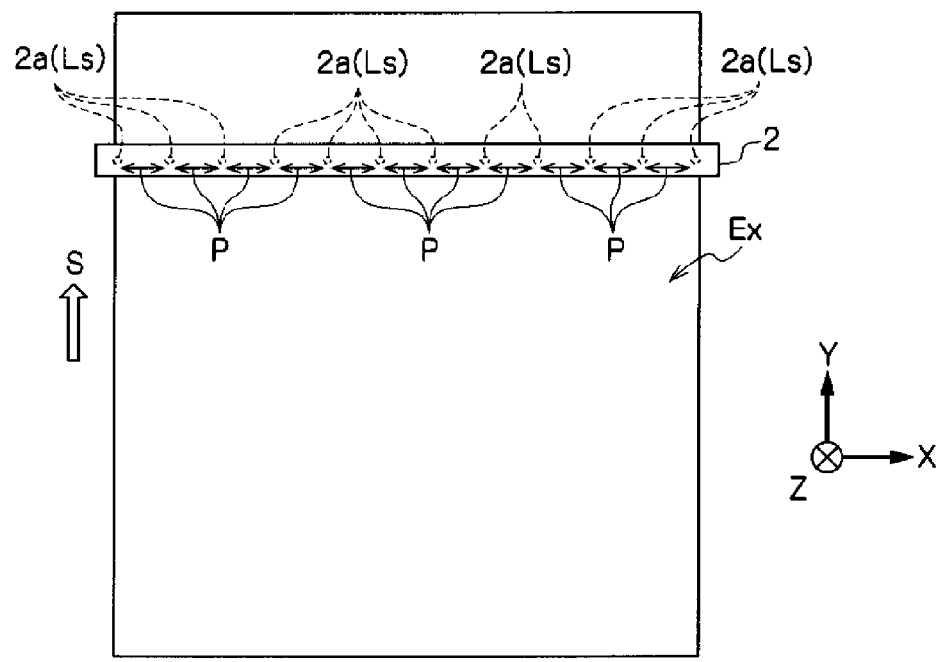
FIG. 1(b) is a plan view.

Embodiments of the invention are described below with reference to the drawings. FIG. 1 is an explanatory diagram illustrating an overall configuration of a beam exposure device according to one or more embodiments of the invention; FIG. 1(a) is a side view, and FIG. 1(b) is a plan view. The beam exposure device 1 is provided with a light-emitting unit 2, a scan unit 3, an optical condensing system 4, and a micro-deflection unit 5.

The light-emitting unit 2 emits light beams Lb from a plurality of light-emitting positions 2a spaced at predetermined intervals along one direction (X direction in the example shown); the light-emitting unit may be composed of light sources such as an LD array, an optical fiber array, a micromirror array or the like.

The scan unit 3 moves one or both of the surface to be exposed EX to a plurality of light beams Lb and the light-emitting unit 2 relatively in another direction (Y direction in the example shown) intersecting with the arrangement direction (X direction in the example shown) of the light-emitting positions 2a. In the example shown, the scan unit 3 is composed of a substrate moving stage that moves a substrate support 11 supporting a substrate 10 that includes the surface to be exposed Ex; however without being limited to this configuration, the scan unit may be composed of a light-emitting unit moving stage for moving the light-emitting unit 2.

The optical condensing system 4 condenses a spot Ls of a light beam Lb emitted from the light-emitting unit 2 onto the surface to be exposed Ex. For instance, the optical condensing system 4 may include an imaging optical system for forming an image of the light-emitting position 2a in the light-emitting unit 2 on the surface to be surface Ex.

The micro-deflection unit 5 micro-deflects the plurality of light beams Lb (refer to arrow P) to thereby expose the space between the beams in the plurality of light beams Lb. The micro-deflection unit 5 may be composed of an acousto-optical element, an electro-optical element or the like. Additionally the micro-deflection unit 5 micro-deflects the plurality of light beams Lb in, for instance, the X direction shown, to thereby produce a scanning exposure inserted between the plurality of light beams Lb on the surface to be exposed Ex.

The beam exposure device 1, for instance, provides exposure in a plane on the surface to be exposed Ex by moving (scanning) the surface to be exposed Ex along the direction of the arrow S (Y direction) relative to the stationary light-emitting unit 2, and reduces the exposure process time by micro-deflecting the scanning of the light beams Lb in the direction intersecting with the moving direction of the surface to be exposed Ex (the direction of the arrow S) to the space between the plurality of light beams Lb (refer to the arrow P).

Figure 2A:
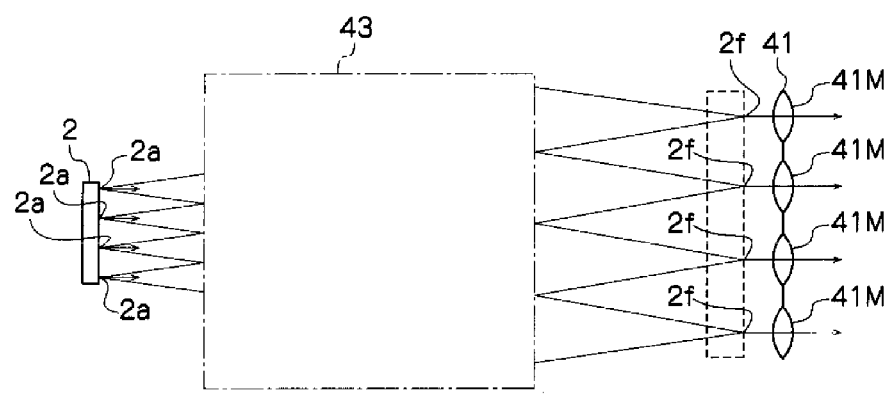
FIG. 2(a) depicts the optical system from the light-emitting unit to just in front of the micro-deflection unit.
Figure 2B:
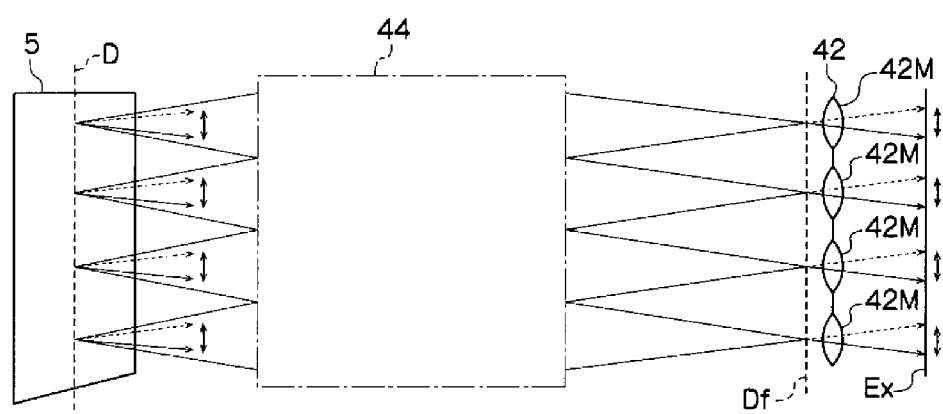
FIG. 2(b) depicts the optical system from the micro-deflection unit up to the surface to be exposed.

FIG. 2 is an explanatory diagram illustrating a configuration example of the optical condensing system used in the beam exposure device; FIG. 2(a) depicts the optical system from the light-emitting unit to just in front of the micro-deflection unit, and FIG. 2(b) depicts the optical system from the micro-deflection unit up to the surface to be exposed. As illustrated in FIG. 2(a), a first microlens array 41 is arranged between the light-emitting unit 2 and the micro-deflection unit 5. The first microlens array 41 is provided with a microlens 41M corresponding to a light-emitting position 2a in the light-emitting unit 2, and configured so that the plurality of light-emitting positions 2a in the light-emitting unit 2 and the plurality of microlenses 41M correspond one-to-one.

As illustrated in FIG. 2(b), a second microlens array 42 is arranged between the micro-deflection unit 5 and the surface to be exposed Ex. The second microlens array 42 is provided with a microlens 42M corresponding to a light-emitting position 2a in the light-emitting unit 2, and is configured to condense the plurality of light beams Lb individually onto the surface to be exposed Ex. Here, the plurality of light-emitting positions 2a in the light-emitting unit 2 and the plurality of microlenses 42M are configured to correspond one-to-one.

In the example illustrated in FIG. 2(a), the beam scanning device is provided with an optical projection system 43 between the light-emitting unit 2 and the micro-deflection unit 5; the optical projection system forms an image 2f of the light-emitting position 2a behind the first microlens array 41. The optical projection system 43 may be a magnification optical projection system that forms a magnified image 2f of the light-emitting position 2a, a reducing optical projection system that forms a reduced image 2f of the light-emitting position 2a, or a same-size optical projection system. In the example illustrated in FIG. 2(a), the interval between the microlens 41M in the first microlens array 41 is larger than the interval between the light-emitting positions 2a, and a magnification optical projection system is adopted as the optical projection system 43.

Additionally in the example shown in FIG. 2(b), a relay lens system 44 is provided between the micro-deflection unit 5 and the surface to be exposed Ex. The relay lens system 44 includes an imaging optical system that forms an image Df of a diffraction surface D in the micro-deflection unit 5 (i.e., an acousto-optical element) near the second microlens array 42.

A beam exposure device 1 provided with this kind of optical condensing system 4 and micro-deflection unit 5 is thusly provided with a first microlens array 41 and a second microlens array 42 which include a plurality of microlenses 41M, 42M corresponding to the light-emitting positions 2*a* in the light-emitting unit 2; because the micro-deflection unit 5 is composed of, for instance, an acousto-optical element which is provided between the first microlens array 41 and the second microlens array 42, the angle of incidence of the plurality of light beams Lb incident on the micro-deflection unit 5 can be made consistent. Hereby, the plurality of light beams Lb may be uniformly micro-deflected even when the deflection properties of the micro-deflection unit 5 used are dependent on the angle of incidence.

The optical condensing system 4 is also provided with an optical projection system 43 that forms an image 2*f* of the light-emitting positions 2*a* behind the first microlens array 41; therefore, even if the pitch of the light-emitting positions 2*a* in the light-emitting unit 2 differs from the pitch of the microlens 41M, both pitches can be accurately made to correspond by selecting the magnifying or the reducing power for the optical projection system 43. Hereby, it is also possible to alleviate the dimensional restrictions that come about when producing the first microlens array 41.

For example, the first microlens array 41 may be a collimating lens that emits parallel light therefrom and causes the parallel light to be incident on the micro-deflection unit 5. Rendering a plurality of light beams Lb into parallel light and causing the parallel light to be incident on the micro-deflection unit 5 makes the deflection from the micro-deflection unit 5 consistent and substantially eliminates distortion of the exposure position or the like. At this point, the image 2*f* of the light-emitting position 2*a* may be formed at the focal position of the microlens 41M so that the microlens 41M emits parallel light; and thus the above optical projection system 43 may be used to accurately merge the position of the image 2*f* with the focal position of the microlens 41M.

Additionally, the optical condensing system 4 is provided with a relay lens system 44 that forms an image Df of the diffraction surface D of the micro-deflection unit 5, composed of such as an acousto-optical element, near the second microlens array 42; therefore, even if the micro-deflection unit 5 has a large deflection angle, the position of the image Df may be brought closer to the microlens 42M to allow the deflected light to efficiently taken into the microlens 42M. Hereby, the light beams Lb emitted from the light-emitting position 2*a* can be condensed onto the surface to be exposed Ex with little loss.

FIG. 3 is an explanatory diagram illustrating a configuration example of a relay lens system in the optical condensing system; FIG. 3(*a*) is a view from the Y direction, and FIG. 3(*b*) is a view from the X direction. Here, the relay lens system used is anamorphic, i.e., an afocal lens system 44*c* having lenses with different curvatures is inserted in the orthogonal direction between two lenses 44*a*, 44*b* having different focal distances. The overall magnifying power of the relay lens system 44 illustrated in FIG. 3 is established as appropriate in accordance with the focal distance (curvature of the lens surface) of individual lenses. In the example illustrated, the relay lens system 44 is configured of four single lenses, however the relay lens system may be an optical system composed of a greater number of lenses. As illustrated in the example, inserting the afocal lens system 44*c* allows the scanning direction of the light beams Lb (i.e., the X direction in the drawing), and the spot position in a direction orthogonal thereto (i.e., the Y direction in the drawing) to be adjusted independently. The anamorphic lens system discussed for this example may also be adopted in the above optical projection system 43.

Figure 4:
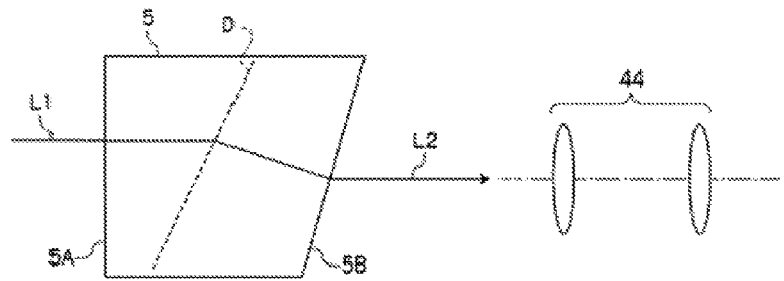
FIG. 4 is an explanatory diagram illustrating a specific configuration example of the micro-deflection unit in a beam exposure device according to one or more embodiments of the invention.

FIG. 4 is an explanatory diagram illustrating a specific configuration example of the micro-deflection unit. In the example illustrated, the acousto-optical element serving as the micro-deflection unit 5 is a prism structure wherein the light-emitting surface 5B slopes in relation to the light incidence surface 5A; hereby, incidence light L1 incident on the micro-deflection unit 5 becomes parallel to the light L2 emitted therefrom (i.e., first order diffraction). Configuring the micro-deflection unit 5 in this manner removes the need for slanting an optical axis of the relay lens system 44 in relation to the incidence light L1, thus simplifying the overall assembly and adjustment of the device.

Figure 5:
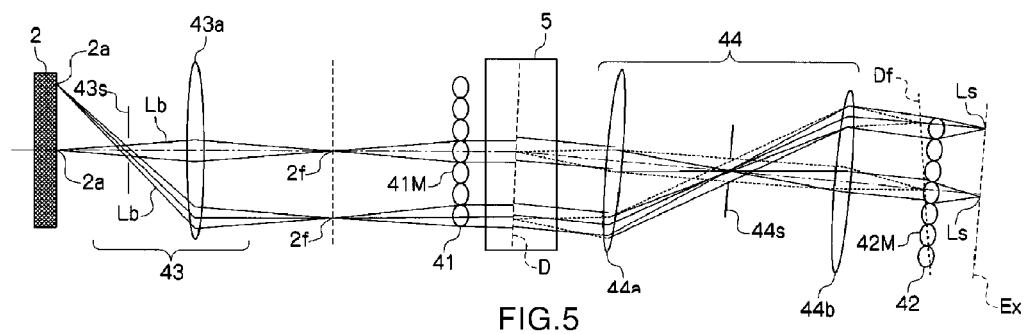
FIG. 5 is an explanatory diagram illustrating a practical example of the optical condensing system in a beam exposure device according to one or more embodiments of the invention.

FIG. 5 is an explanatory diagram illustrating a practical example of the optical condensing system in a beam exposure device according to one or more embodiments of the invention. Parts in common with those previously described are given the same reference numerals, and the overlapping descriptions are omitted. In the example illustrated, the optical projection system 43 and the first microlens array 41 are arranged in front of the light-emitting unit 2, and the light beams Lb passing through the first microlens array 41 are incident on the micro-deflection unit 5. The relay lens system 44 and the second microlens array 42 are arranged in front of the micro-deflection unit 5, and the beam spots Ls condensed by the second microlens array 42 form an image on the surface to be exposed Ex.

In this example, the optical projection system 43, composed of a lens stop 43*s* and a projection lens 43*a*, forms an image 2*f* of each of the light-emitting positions 2*a* in the light-emitting unit 2 at the focal position of each microlens 41M in the first microlens array 41. The microlens 41M is a collimating lens that emits parallel light therefrom which is incident on the micro-deflection unit 5.

The relay lens system 44, composed of a lens 44*a*, 44*b* and a lens stop 44*s* inserted between the lens 44*a* and 44*b*, forms an image Df of the diffraction surface D in the micro-deflection unit 5 which is an acousto-optical element near the second microlens array 42. In the drawing the light passing through the micro-deflection unit 5 is depicted with solid lines, and a conjugate relationship in the relay lens system 44 is depicted with dotted lines. Light passing through one point on the diffraction surface D of the micro-deflection unit 5 and emitted at a different angle is associated with one point on the image Df formed near the second microlens array 42, and is thereafter incident on the microlens 42M at yet a different angle.

Figure 6:
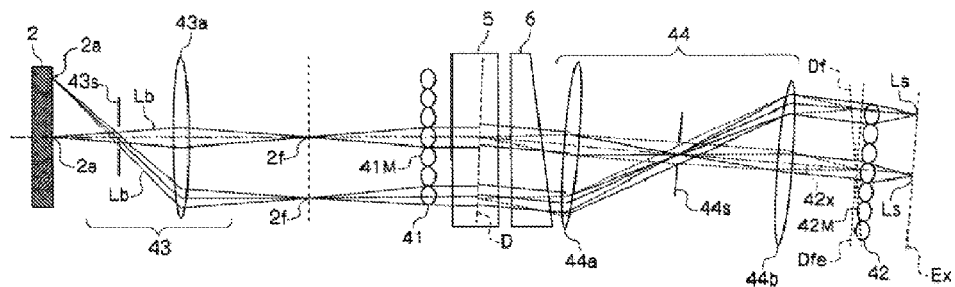
FIG. 6 is an explanatory diagram illustrating a practical example of the optical condensing system in a beam exposure device according to one or more embodiments of the invention.

FIG. 6 is an example of an improvement made to the example depicted in FIG. 5. Parts in common with those previously described are given the same reference numerals, and a portion of the overlapping descriptions omitted. In the example illustrated in FIG. 5 an acousto-optical element serves as the micro-deflection unit 5 and the image Df of the diffraction surface D is likely to be inclined relative to an optical axis 42*x* of the second microlens array 42. If the image Df of the diffraction surface D is inclined in relation to the optical axis 42*x* of the second microlens array 42 in this manner, the distance between the deflection pivot of the light beams forming the image Df and each of the second microlenses 42M differs; when the deflected beams have a large amplitude, a portion of the beams do not enter the second microlenses 42M, making it likely that the angle of the beams that have passed through the second microlenses 42M will differ for an individual second microlens 42M.

In contrast, the example improvement illustrated in FIG. 6 places a compensating optical element 6 between the micro-deflection unit 5 and the relay lens system 44 so that the image Dfe of the diffraction surface D is orthogonal to the optical axis 42x of the second microlens array 42. The compensating optical element 6 may be composed of a prism that includes a light-emitting surface that is inclined relative to the arrangement direction of the second microlens array 42. Providing this kind of compensating optical element 6 allows the deflected beams incident on the second microlenses 42M without loss, and makes the beam spots Ls uniform.

Figure 7:
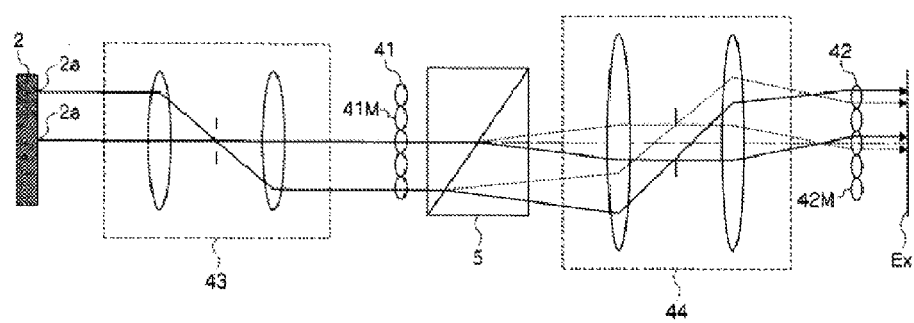
FIG. 7 is an explanatory diagram illustrating a practical example of the optical condensing system in a beam exposure device according to one or more embodiments of the invention.

FIG. 7 is an explanatory diagram illustrating a practical example of the optical condensing system in a beam exposure device according to one or more embodiments of the invention. Parts in common with those previously described are given the same reference numerals, and the overlapping descriptions are omitted. In the example illustrated, the micro-deflection unit 5 is an electro-optical element. When the micro-deflection unit 5 is an electro-optical element, the beam is deflected with an applied voltage of zero being the center, i.e., a deflection angle of zero; the fine beam deflection angle allows the beams to be efficiently deflected and then incident on the second microlenses 42M without needing to use the above compensating optical element 6.

A beam exposure device 1 according to the above-described embodiments of the invention shortens exposure process time by using micro-deflection of a plurality of light beams Lb which exposes the space between the light beams Lb; the micro-deflection is uniform when an acousto-optical element is used for micro-deflection, and thereby allows the beam exposure device 1 to provide highly-precise two dimensional exposure.

Embodiments of the invention are described above with reference to the drawings; however, these embodiments are not limited to the specific configurations described; design modifications and the like that are within the scope of the technical concepts of the invention are considered a part of the invention. Each of the above described embodiments may be combined using the techniques taught therein insofar without departing from the scope of the present invention. Accordingly, the scope of the invention should be limited only by the attached claims.

REFERENCE NUMERALS

1: Beam exposure device, 2: Light-emitting unit,
2a: Light-emitting position, 2f: Image (of light-emitting position),
3: Scan unit, 4: Optical condensing system,
41: First microlens array, 41M: Microlens,
41: Second microlens array, 42M: Microlens,
43: Optical projection system, 43a: Projection lens, 43s: Lens stop
44: Relay lens system, 44a, 44b: Lens
44c: Afocal lens system, 44s: Lens stop, 44x: Optical axis
5: Micro-deflection unit, D: Diffraction surface, Df, Dfe: Image (of diffraction surface)
6: Compensating optical element,
10: Substrate, 11: Substrate support
Lb: Light beam, Ls: Spot, Ex: Surface to be exposed

The invention claimed is:

1. A beam exposure device comprising:
a light-emitting unit that emits light beams from a plurality of light-emitting positions spaced at predetermined intervals along one direction;
a scan unit that moves one or both of a surface to be exposed to a plurality of light beams and the light-emitting unit relatively in another direction intersecting with the one direction;
an optical condensing system that condenses a spot of the light beam emitted from the light-emitting unit onto the surface to be exposed; and
a micro-deflection unit that micro-deflects the plurality of light beams to expose the space between the beams in the plurality of light beams;
wherein the optical condensing system includes:
a first microlens array arranged between the light-emitting unit and the micro-deflection unit, and provided with a plurality of microlenses with each of the microlens corresponding to the light-emitting position in the light-emitting unit;
a second microlens array arranged between the micro-deflection unit and the surface to be exposed, and provided with a plurality of microlenses with each microlens corresponding to the light-emitting position in the light-emitting unit; and
an optical projection system that forms an image of the light-emitting position in the light-emitting unit at a focal position of each microlens in the first microlens array,
the first microlens array converts each of the light beams in the plurality of light beams into parallel light and causes the parallel light to be incident on the micro-deflection unit, and
the second microlens array condenses the plurality of light beams individually onto the surface to be exposed.

2. The beam exposure device according to claim 1, wherein the optical projection system is a magnification optical projection system.

3. The beam exposure device according to claim 1, wherein the micro-deflection unit is composed of an acousto-optical element.

4. The beam exposure device according to claim 3, further comprising a relay lens system that forms an image of the diffraction surface in the micro-deflection unit near the second microlens array.

5. The beam exposure device according to claim 4, further comprising a compensating optical element arranged between the micro-deflection unit and the relay lens system, which causes the image of the diffraction surface to be orthogonal to an optical axis of the second microlens array.

* * * * *